United States Patent
Ripley

(10) Patent No.: US 12,199,515 B2
(45) Date of Patent: *Jan. 14, 2025

(54) POWER MANAGEMENT SYSTEMS AND METHODS RELATED TO A PLURALITY OF CONVERTERS FOR PROVIDING DUAL INTEGRATED MULTI-MODE POWER MANAGEMENT

(71) Applicant: SKYWORKS SOLUTIONS, INC., Irvine, CA (US)

(72) Inventor: David Steven Ripley, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/478,888

(22) Filed: Sep. 29, 2023

(65) Prior Publication Data

US 2024/0106333 A1    Mar. 28, 2024

Related U.S. Application Data

(63) Continuation of application No. 17/588,129, filed on Jan. 28, 2022, now Pat. No. 11,777,407, which is a continuation of application No. 15/993,590, filed on May 30, 2018, now Pat. No. 11,239,755.

(60) Provisional application No. 62/512,595, filed on May 30, 2017.

(51) Int. Cl.
| H02M 3/158 | (2006.01) |
| H03F 1/02 | (2006.01) |
| H03F 3/213 | (2006.01) |
| H03F 3/24 | (2006.01) |
| H02M 1/00 | (2006.01) |

(52) U.S. Cl.
CPC ........ *H02M 3/1582* (2013.01); *H03F 1/0211* (2013.01); *H03F 3/213* (2013.01); *H03F 3/245* (2013.01); *H02M 1/008* (2021.05); *H03F 2200/504* (2013.01)

(58) Field of Classification Search
CPC ... H02M 1/008; H02M 3/1582; H03F 1/0211; H03F 3/213; H03F 3/245; H03F 2200/504
See application file for complete search history.

(56) References Cited

U.S. PATENT DOCUMENTS

| 6,469,478 | B1 | 10/2002 | Curtin |
| 6,515,457 | B1 | 2/2003 | Maniktala |
| 7,868,601 | B1 | 1/2011 | Li |
| 9,461,590 | B2 | 10/2016 | Langer |
| 11,239,755 | B2 * | 2/2022 | Ripley ................ H02M 3/1582 |
| 2002/0011824 | A1 | 1/2002 | Sluijs |

(Continued)

*Primary Examiner* — Kyle J Moody
*Assistant Examiner* — Jye-June Lee
(74) *Attorney, Agent, or Firm* — Chang & Hale LLP

(57) ABSTRACT

A power management device is disclosed, including a first DC-DC converter coupled to a first output voltage line, a second DC-DC converter coupled to a second output voltage line, a first set of switches associated with the first DC-DC converter, and a second set of switches associated with the second DC-DC converter. The power management device may further include a controller configured to toggle one or more switches of the first set of switches and one or more switches of the second set of switches, and a multi-mode radio-frequency front-end block communicatively coupled to the controller.

20 Claims, 9 Drawing Sheets

(56) References Cited

U.S. PATENT DOCUMENTS

| | | |
|---|---|---|
| 2002/0093315 A1 | 7/2002 | Sluijs |
| 2002/0175764 A1 | 11/2002 | Matsuura et al. |
| 2006/0128324 A1 | 6/2006 | Tan et al. |
| 2008/0278136 A1 | 11/2008 | Murtojarvi |
| 2014/0218109 A1 | 8/2014 | Wimpenny |
| 2015/0042282 A1 | 2/2015 | Oga |
| 2016/0173031 A1* | 6/2016 | Langer .................... H03F 3/189 330/126 |
| 2016/0241138 A1 | 8/2016 | Pehlke |
| 2016/0241208 A1 | 8/2016 | Lehtola |
| 2016/0241299 A1* | 8/2016 | Ripley ................. H02M 3/158 |
| 2016/0301366 A1 | 10/2016 | Sato et al. |
| 2017/0005494 A1 | 1/2017 | Li et al. |
| 2018/0048272 A1 | 2/2018 | Lin et al. |
| 2018/0097385 A1 | 4/2018 | Li |

\* cited by examiner

POWER MANAGEMENT SYSTEMS AND METHODS RELATED TO A PLURALITY OF CONVERTERS FOR PROVIDING DUAL INTEGRATED MULTI-MODE POWER MANAGEMENT

CROSS-REFERENCE TO RELATED APPLICATION(S)

This application is a continuation of U.S. patent application Ser. No. 17/588,129, filed Jan. 28, 2022, entitled "POWER MANAGEMENT SYSTEMS AND METHODS RELATED TO A PLURALITY OF CONVERTERS FOR PROVIDING DUAL INTEGRATED MULTI-MODE POWER MANAGEMENT," which is a continuation of U.S. patent application Ser. No. 15/993,590, filed May 30, 2018, entitled "SYSTEMS AND METHODS FOR DUAL INTEGRATED POWER MANAGEMENT," now U.S. Pat. No. 11,239,755, issued Feb. 1, 2022, which claims priority to U.S. Provisional Application No. 62/512,595, filed May 30, 2017, entitled "SYSTEMS AND METHODS FOR DUAL INTEGRATED POWER MANAGEMENT." The content of each of the above-referenced application is hereby expressly incorporated by reference herein in its entirety for all purposes.

BACKGROUND

Field

The present disclosure generally relates to power management of power amplifiers and front-end circuitry used in electronic devices.

Description of the Related Art

Carrier aggregation is one of the most heavily relied upon design techniques to enable evolution of mobile communications. As carrier aggregation becomes more heavily relied upon in electronic devices, power management of power amplifiers and other front-end circuitry for various frequency bands must keep up with the need for simultaneous communications over more than one band at a time. However, existing techniques for meeting this need typically require large component counts and inefficient implementations of circuitry.

SUMMARY

In accordance with some implementations, the present disclosure relates to a power management device. The power management device comprises a first DC-DC converter coupled to a first output voltage line, a second DC-DC converter coupled to a second output voltage line, a first set of switches associated with the first DC-DC converter, and a second set of switches associated with the second DC-DC converter.

In some embodiments, the first DC-DC converter is a boost converter, and in some embodiments, the second DC-DC converter is a buck/boost converter.

In some embodiments, the power management device further comprises a controller configured to toggle one or more switches of the first set of switches and one or more switches of the second set of switches. In some embodiments, the controller is configured to receive feedback from the first output voltage line and to receive feedback from the second output voltage line. In some embodiments, the controller toggles the one or more switches of the first set of switches and the one or more switches of the second set of switches based on the feedback received from the first output voltage line and the second output voltage line.

In some embodiments, the power management device further comprises a multi-mode radio-frequency front-end block communicatively coupled to the controller. In some embodiments, the multi-mode radio-frequency front-end block includes a plurality of registers defining a set of output voltages on the first output voltage line and the second output voltage line.

In some embodiments, the first DC-DC converter, the second DC-DC converter, the controller and the multi-mode radio-frequency front-end block are all implemented on a single semiconductor die.

In some embodiments, the first DC-DC converter is coupled to a third output voltage line.

In some embodiments, the power management device further comprises a third set of switches coupled to the third output voltage line. In some embodiments, the power management device further comprises a fourth set of switches coupled to the first output voltage line and the second output voltage line. In some embodiments, the power management device further comprises a fifth set of switches coupled to the first output voltage line and the third output voltage line. In some embodiments, the power management device further comprises a sixth set of switches coupled to the second output voltage line and the third output voltage line.

In some embodiments, the first output voltage line is configured to be coupled to a first front-end power amplification block, the second voltage line is configured to be coupled to a second front-end power amplification block, and the third voltage line is configured to be coupled to a third front-end power amplification block.

In some embodiments, the third output voltage line is coupled to the first DC-DC converter and the second DC-DC converter. In some embodiments, the first DC-DC converter is coupled to a first inductor, and the second DC-DC converter is coupled to a second inductor. In some embodiments, the first inductor is coupled to a supply voltage and the second inductor is switchably coupled to the supply voltage. In some embodiments, one or more switches of the first set of switches and second set of switches are field-effect transistors.

The present disclosure also relates to a method for converting voltage. The method includes implementing a first DC-DC converter in a power management unit, implementing a second DC-DC converter in the power management unit, and implementing a controller communicatively coupled to a first output line of the first DC-DC converter and communicatively coupled to a second output line of the second DC-DC converter. The method further comprises coupling the power management unit to a supply voltage and providing one or more output voltages on the first output line and the second output line.

In some embodiments, providing the one or more output voltages includes toggling one or more switches of a first set of switches in the first DC-DC converter and toggling one or more switches of a second set of switches in the second DC-DC converter.

The present disclosure also relates to a power management integrated circuit. The power management integrated circuit comprises a semiconductor substrate, a first DC-DC converter with a first set of switches formed on the semiconductor substrate, a second DC-DC converter with a second set of switches formed on the semiconductor substrate, and a controller formed on the semiconductor substrate, the controller configured to toggle one or more switches of the first set of switches and toggle one or more switches of the second set of switches.

In some embodiments, the semiconductor substrate includes a silicon substrate. In some embodiments, the semiconductor substrate includes a silicon-on-insulator substrate.

The present disclosure also relates to a packaged module for processing a signal. The packaged module comprises a packaging substrate configured to receive a plurality of components, a first DC-DC converter with a first set of switches, a second DC-DC converter with a second set of switches and a controller configured to toggle one or more switches of the first set of switches and toggle one or more switches of the second set of switches.

In some embodiments, the first DC-DC converter, the second DC-DC converter and the controller are implemented on a common semiconductor die.

The present disclosure also relates to a wireless device. The wireless device comprises an antenna configured to receive a signal, an amplifier assembly in communication with the antenna and configured to amplify the signal, a power management device comprising a first DC-DC converter coupled to a first output voltage line, a second DC-DC converter coupled to a second output voltage line, a first set of switches associated with the first DC-DC converter and a second set of switches associated with the second DC-DC converter and a transceiver in communication with the amplifier assembly and the power management device and configured to process the amplified signal.

In some embodiments, the wireless device is a cellular phone configured to operate in one or more cellular bands.

DESCRIPTION

The headings provided herein, if any, are for convenience only and do not necessarily affect the scope or meaning of the claimed invention.

Figure 1:
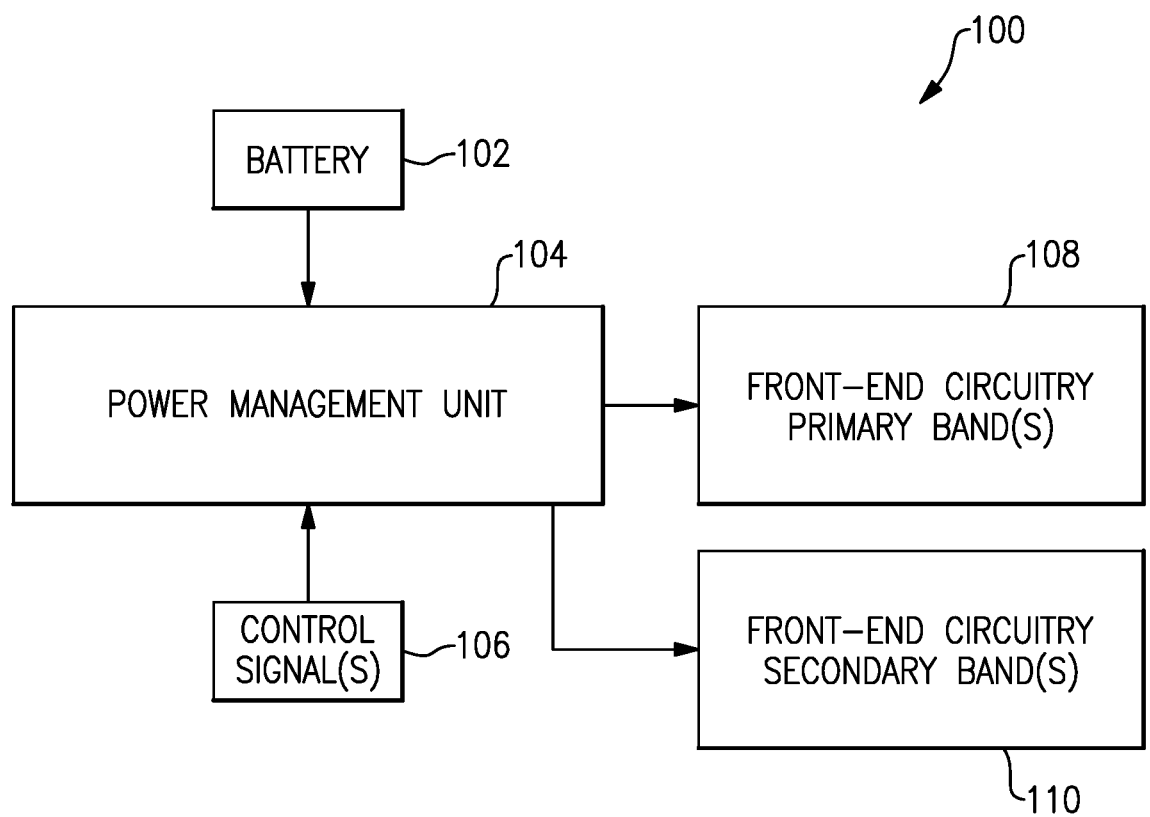
FIG. 1 is a block diagram illustrating a power management system configured to provide two or more regulated output voltages, according to some embodiments of the present disclosure.

FIG. 1 illustrates a schematic diagram of a power management system 100 configured to provide two (or more) regulated output voltages. In some embodiments, power management system 100 is configured to simultaneously provide multiple regulated output voltages, for instance to support front-end circuitry for multiple operating frequency bands of a radio-frequency (RF) communication system. As shown in FIG. 1, a power management unit (PMU) 104 may be coupled within a power management system 100 to a voltage source 102 (e.g., a battery), and one or more control signals 106. In some embodiments, voltage source 102 provides a DC voltage. In some embodiments, voltage source 102 provides an AC voltage. In some embodiments, a voltage source 102, such as a battery, does not provide a constant voltage level, and PMU 104 converts the input voltage to a desired output voltage level.

The PMU 104 may also be connected to one or more front-end circuit blocks 108, 110, as shown in FIG. 1, where a respective front-end circuit block is assigned to support one or more frequency bands or one or more sets of frequency bands. For example, front-end circuit block 108 may be configured to support transmission and reception of high-band signals (e.g., signals with a frequency of 2300 MHz or higher), while front-end circuit block 110 may be configured to support transmission and reception of low-band and mid-band signals (e.g., signals from 700 MHz up to 2300 MHz). Although not shown in FIG. 1, PMU 104 may be configured to provide regulated output voltages to any number of front-end circuit blocks, each supporting different signal frequency bands.

FIG. 1 illustrates an embodiment of a unique power management system 100 for an RF communications system, implementing a single PMU 104 configured to support a plurality of front-end circuit blocks in simultaneous operation. Power management system 100 allows for a reduction in components and circuitry, compared to traditional power management solutions that require a dedicated power management unit for a respective front-end circuit block. In some implementations, a front-end circuit block 108, 110 includes components such as, but not limited to power amplifiers, filters, switches and diplexers. Alternatively, traditional power management solutions implementing a single PMU tied to a plurality of front-end circuit blocks 108, 110 do not allow for simultaneous operation of the plurality of front-end circuit blocks.

Power amplifier systems are often powered using a supply voltage 102 (e.g., from a battery). In some implementations, the voltage from the battery is regulated (e.g., with a buck converter or a boost converter) to a fixed value to compensate for variations in the voltage output from the battery due to manufacturing variation, age, temperature, discharge or other effects. Failure to employ such a regulator can result in a change in the compression characteristics of the power amplifier and degrade its linearity. Failure to employ a buck converter can result in undesirable current leakage and faster discharge of the supply voltage 102. However, use of a regulator increases the overall cost of the system. In some embodiments, PMU 104 includes one or more voltage regulators configured to provide a higher or lower voltage than an available supply voltage 102.

Power management using regulators and/or power management units is widely used in wireless devices, such as smartphones and other mobile devices, to increase the power amplifier (PA) efficiency and linearity. Certain protocols and wireless standards use relatively high bandwidths and therefore, improvements to typical power management strategies would be advantageous. For example, LTE advanced uses higher modulation bandwidth (e.g., about 40 MHz) than previous standards (e.g., less than or equal to about 20 MHz). In another example, HPUE support requires an increase in current over existing requirements for low, mid and high-band communications. In addition, uplink carrier aggregation of two or more cellular bands results in the need for increased power to be delivered by the PA. A typical front end module designed to handle these protocols (e.g., LTE Advanced) generally includes filters and switches that may not have been previously used or necessary. This increase in components can result in additional losses in the transmission path. Accordingly, there is a need to increase the power delivered to the antenna port to accommodate these additional losses and increases in power requirements for updated communication standards. Another driving design principle is to reduce the overall area usage of modules and components in a device implementing such an RF communication system (e.g., a wireless device).

Disclosed herein are various examples of circuits, devices and methods that can be configured to, among other things, address the foregoing challenges associated with power management systems. In some implementations, a power management system includes a single power management unit 104 coupled to a set of one or more power amplifiers (e.g., within respective front-end circuit blocks such as blocks 108, 110). The PMU 104 is configured to efficiently boost or lower a received input voltage (e.g., battery voltage 102) while supplying a DC-DC regulated output voltage to each of a set of one or more front-end circuit blocks (e.g., blocks 108, 110), each front-end circuit block comprising a set of one or more power amplifiers. Wireless communications configurations with such power management systems can provide uplink carrier aggregation and/or cellular signals based on standards and protocols that require increased bandwidth (e.g., at least about 40 MHz) and/or power (e.g., at least about 31 dBm), such as LTE-Advanced.

As an example of increased power requirements, LTE power delivered at an antenna as required by the 3GPP standard is 23 dBm. Assuming a 5 dB-loss due to filters, duplexers, switches, diplexers, board losses, and the like, the PA should be configured to deliver at least about 28 dBm at a bandwidth of about 20 MHz. For LTE Advanced, the modulation uplink bandwidth is increased from 20 MHz to 40 MHz. To achieve the same or similar signal to noise ratio (SNR) with the higher modulation bandwidth (assuming the same propagation environment), the output power of the PA should be increased to about 31 dBm for the output power delivered by the PA for an increase from 20 MHz to 40 MHz. Traditional solutions for an increased power requirement included incorporating larger passive devices such as larger inductors, and larger switch devices. Both of these design strategies result in undesirable compromises regarding an increase in die area and module area. These larger components may also degrade performance for lower current operation.

As described herein, a power management system 100 can be configured to provide carrier-aggregation (CA) functionality within an RF communications system, such that a plurality of input signals can be processed and combined into a common signal path. Various examples are described herein in the context of RF amplifiers; however, it will be understood that one or more features of the present disclosure can also be implemented in other types of amplifiers.

Figure 2:
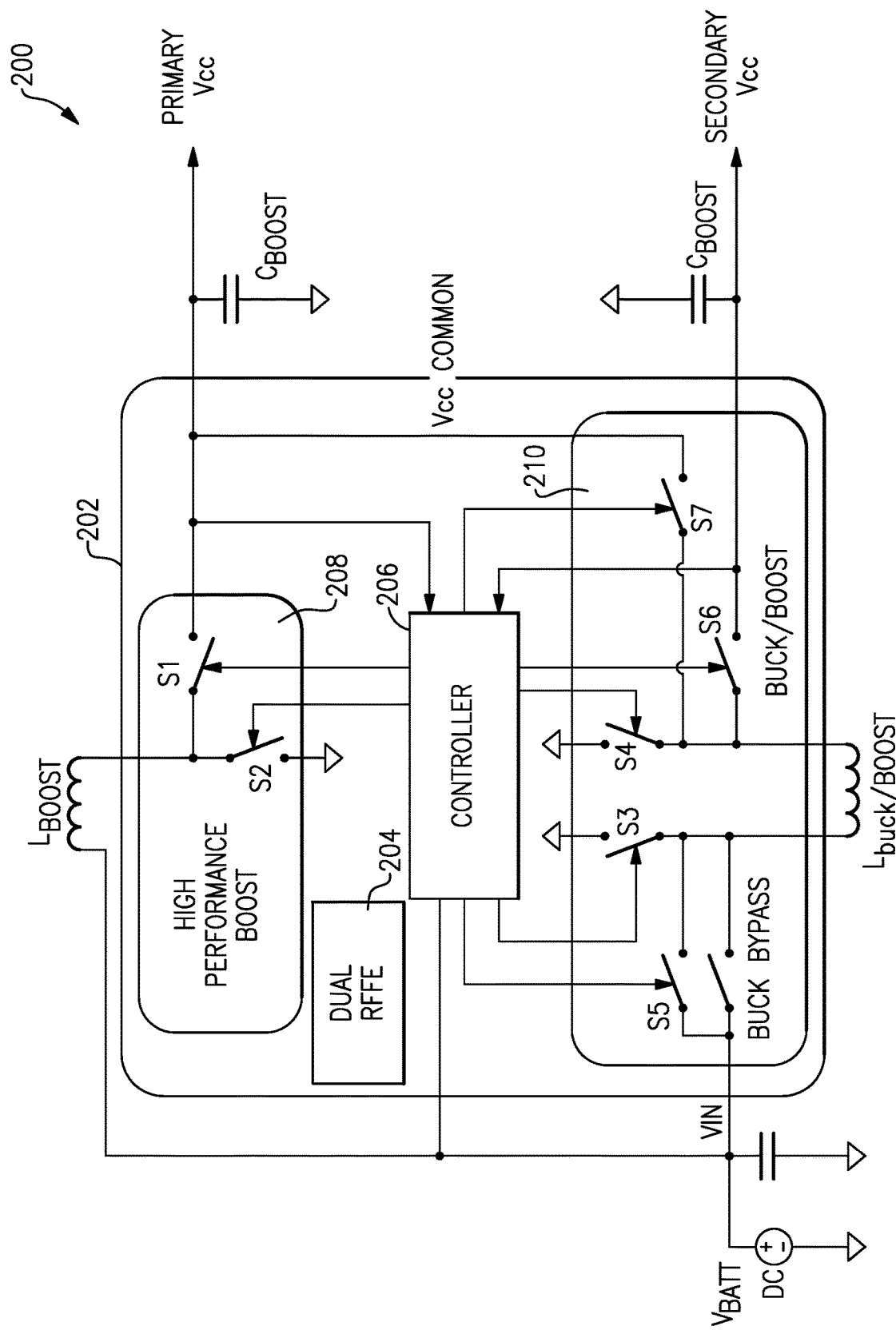
FIG. 2 is a schematic diagram illustrating a power management device with two output voltage lines, according to some embodiments of the present disclosure.

FIG. 2 illustrates an example of a power management unit 200, in accordance with some implementations as described herein. In the example of FIG. 2, a power management chip (PMIC) 202 (e.g., integrated circuit, semiconductor die) includes at least some of the circuitry of PMU 200. For example, as shown in FIG. 2, in some implementations, a PMIC 202 includes a set of DC-DC converters, such as DC-DC converter 208 (e.g., boost converter) and DC-DC converter 210 (e.g., buck/boost converter). In some implementations, a PMIC 202 and/or PMU 200 includes a controller block 206, configured to open and close one or more switches corresponding to each DC-DC converter. In some implementations, a PMIC 202 and/or PMU 200 includes a multi-mode radio-frequency front-end (RFFE) block 204. In some implementations, RFFE block 204 includes registers corresponding to output voltage settings for one or more frequency bands. In some implementations, the RFFE block conforms to the MIPI RFFE standard.

PMU 200 includes a first set of switches corresponding to DC-DC converter 208 (e.g., a high performance boost converter), and a second set of switches corresponding to DC-DC converter 210 (e.g., a buck/boost converter). In the example of FIG. 2, the switches of the one or more DC-DC converters may be implemented as diodes, field-effect transistors (FETs), bipolar-junction transistors (BJTs) or any other comparable switching device.

DC-DC converter 208 includes a first set of switches to enable conversion of an input DC voltage to a desired output DC voltage. In the example of converter 208, there are two switches, S1 and S2 in the first set of switches, to enable converter 208 to boost an input voltage. For example, during a charging phase, S2 is closed (e.g., in response to receiving a signal from controller 206), allowing the inductor $L_{boost}$ to store power. During a discharging or boost phase, S2 is opened (e.g., in response to receiving a signal from controller 206) and S1 is closed, effectively boosting the voltage seen at the Primary VCC output over the input voltage. Controller block 206 receives feedback about the voltage seen at the Primary VCC output, and uses this feedback to adjust the charging and discharging phases (e.g., duration of time S1 or S2 is closed), in order to achieve a desired output voltage.

In some embodiments, DC-DC converter 210 may be used to increase, or boost, the input voltage just as described above, with respect to DC-DC converter 208. In the example shown in FIG. 2, converter 210 is a buck/boost converter comprising a second set of switches, namely S3, S4, S5, S6 and S7. In some implementations, S5 is a single switch and in some implementations it is a pair of switches as shown in FIG. 2. In some embodiments, DC-DC converter 210 may be used to provide a lower output voltage than the input voltage. For example, controller 206 sends signals to open or close one or more switches of the second set of switches to configure DC-DC converter 210 as a buck converter to provide a lower output voltage or as a boost converter to provide a higher output voltage.

In some embodiments, DC-DC converter 210 (or an additional converter within PMIC 202) is coupled to more than one output voltage line. For example, as shown in FIG. 2, DC-DC converter 210 is tied to the Primary $V_{CC}$ line when S7 is closed, as well as the Secondary $V_{CC}$ line when S6 is closed. That is to say that DC-DC converter 210 is configured to be switchably coupled to more than one output voltage port, pin or line.

This architecture for PMIC 202 allows for a highly versatile set of operating modes, where DC-DC converter 210 can be used to provide a lower output voltage than the supply voltage ($V_{BATT}$) on either output voltage line. DC-DC converter 208 can be used to provide a higher output voltage than the supply voltage ($V_{BATT}$) on the Primary $V_{CC}$ output voltage line and DC-DC converter 210 can be used to provide a higher output voltage than the supply voltage ($V_{BATT}$) on the Secondary $V_{CC}$ output voltage line.

Additionally, both DC-DC converters (e.g., a plurality of converters) 208 and 210 can be used to provide higher output power on the Primary $V_{CC}$ output line than can be provided for by either DC-DC converter alone. For example, both DC-DC converters 208 and 210 can be configured to operate as boost converters by having corresponding switches opened or closed. In this example, as S2 is closed in the charging state of $L_{boost}$ of DC-DC converter 208 and S1 is opened, S7 of DC-DC converter 210 can be closed in order to discharge $L_{buck/boost}$ and provide an additional source of current to boost the Primary $V_{CC}$ output power level.

Figure 3:
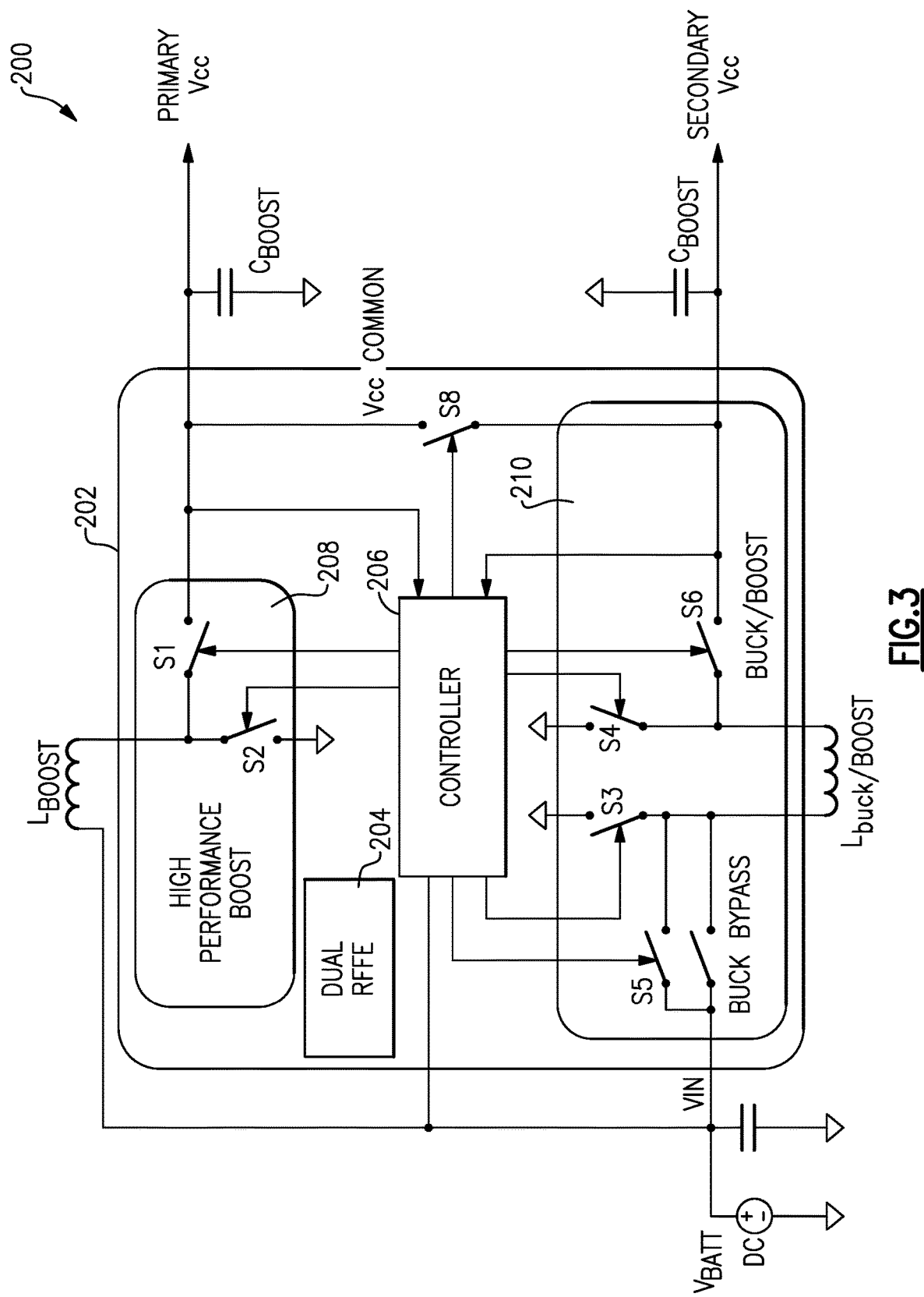
FIG. 3 is a schematic diagram illustrating a power management device with two output voltage lines, according to some embodiments of the present disclosure.

FIG. 3 illustrates another configuration for a PMU 200 without switch S7 of FIG. 2, and a third (or otherwise distinct from first and second) set of switches implemented within PMIC 202 and outside of either DC-DC converter 208 or 210. In this example, the third set of switches includes S8, a switch tying both output voltage lines together. The configuration shown in FIG. 3 allows for the same voltage to be provided at each output voltage line when S8 is closed.

Applications of the power management units and systems described herein are particularly useful for RF communications activities, such as carrier aggregation. It should be noted that various cellular bands, including those disclosed herein, can be carrier-aggregated, assuming that within a given group the corresponding bands do not overlap. While FIG. 2 and FIG. 3 refer to a PMIC and PMU implementing two DC-DC converters, it should be understood that additional DC-DC converters can be implemented within a single PMU and/or PMIC, each additional DC-DC converter providing an additional output voltage line.

Figure 4:
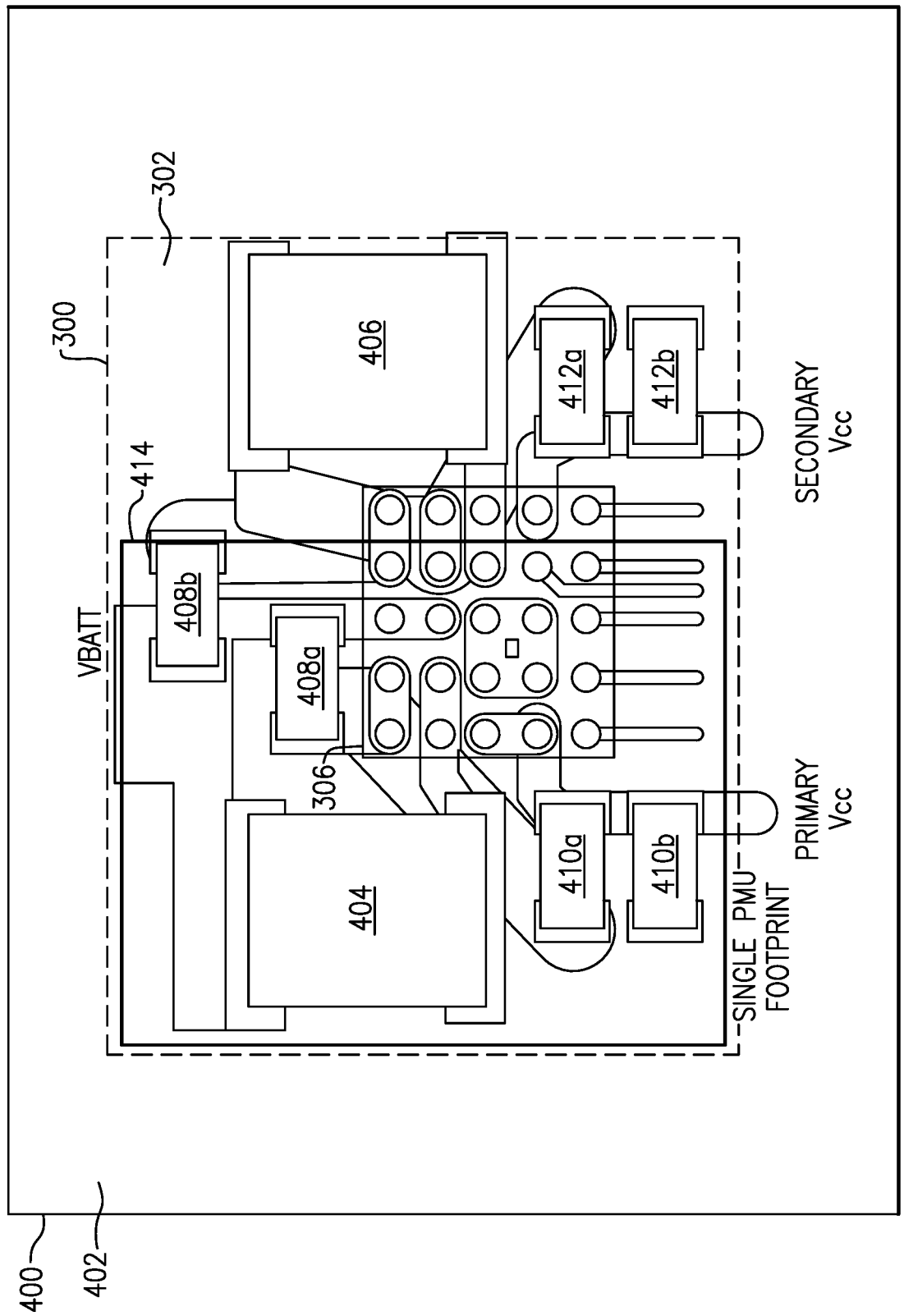
FIG. 4 is a graphical representation of a packaged module comprising a power management device, according to some embodiments of the present disclosure.

FIG. 4 is a graphical representation of a packaged module comprising a power management device, according to some embodiments of the present disclosure. FIG. 4 illustrates an example physical layout of a PMU 300, implemented on substrate 302. For example, as shown in FIG. 4, PMU 300 includes a PMIC 306 implemented as a semiconductor die with a flip-chip packaging interface mounted on a printed circuit board (PCB). Passive components such as inductors 404 and 406, as well as capacitors 408a, 408b, 410a, 410b, 412a and 412b are implemented on substrate 302 of PMU 300. In some embodiments, capacitor 408a is an input capacitor for a primary DC-DC converter of PMU 300, and is tied to $V_{IN}$ and a first common ground. In some embodiments, capacitor 408b is an input capacitor for a secondary DC-DC converter of PMU 300, and is tied to $V_{IN}$ and a second common ground.

In some embodiments, inductor 404 is an inductor for the primary DC-DC converter of PMU 300, such as $L_{boost}$ described with respect to FIG. 2 and FIG. 3. In some embodiments, inductor 406 is an inductor for the secondary DC-DC converter of PMU 300, such as $L_{buck/boost}$ described with respect to FIG. 2 and FIG. 3. In some embodiments, capacitors 410a and 410b are output capacitors for the primary DC-DC converter of PMU 300, and capacitors 412a and 412b are output capacitors for the secondary DC-DC converter of PMU 300.

FIG. 4 illustrates the significant area savings achieved by implementing multiple DC-DC converters in a single PMU 300. As can be seen from footprint 414, a single PMU would require the majority of passive components and size of the PMIC in order to support a single DC-DC converter. Furthermore, traditional PMUs only implement a boost converter, resulting in a wastage of power to provide a lower output voltage than the one provided as a supply voltage (e.g., $V_{BATT}$). As a result, PMU 300 offers a more versatile power management design, as well as a reduction in area required to implement it on package substrate 402 of package 400.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 5:
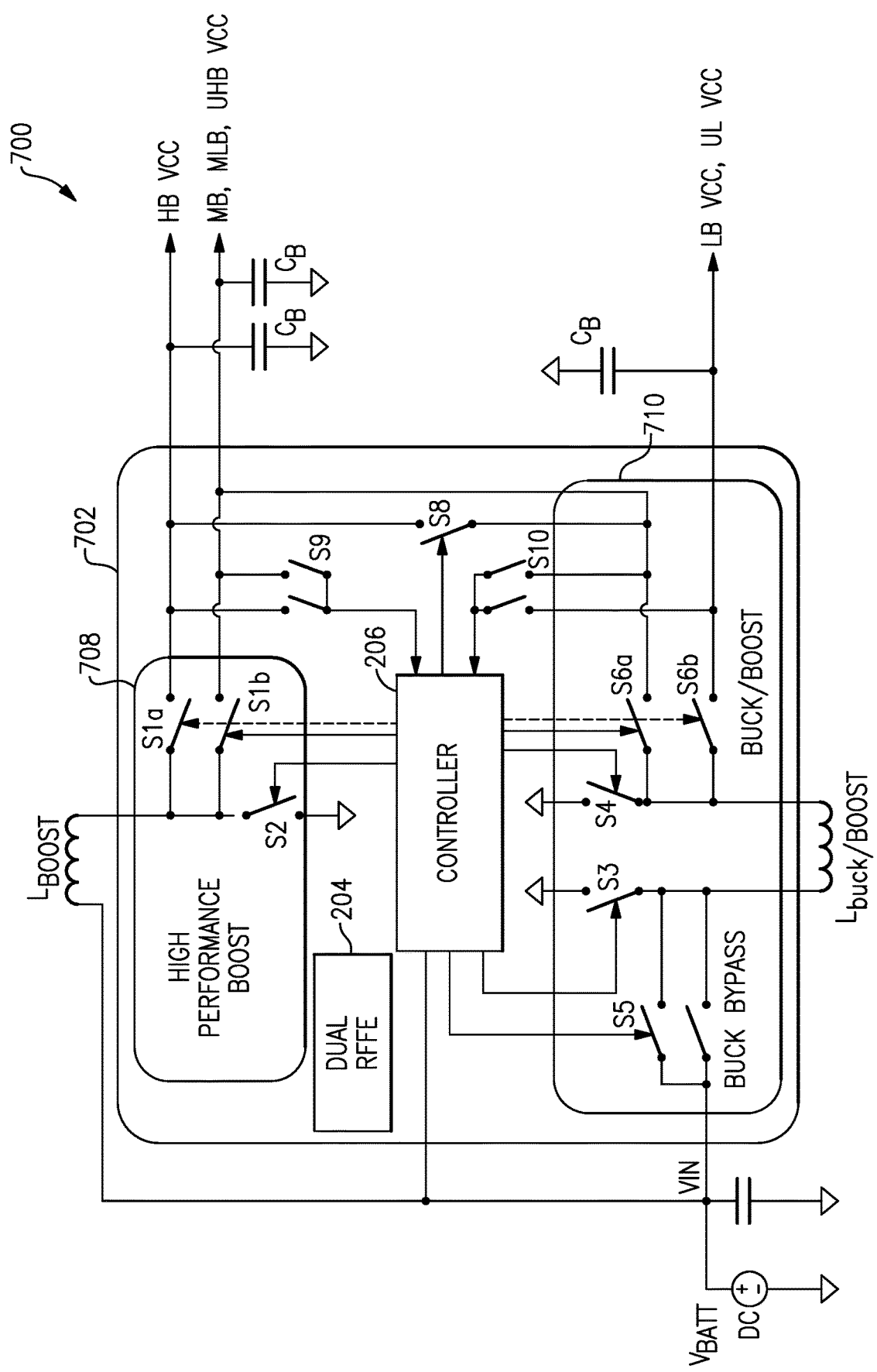
FIG. 5 is a schematic diagram of a power management device with three output voltage lines, according to some embodiments of the present disclosure.

FIG. 5 is a schematic diagram of a power management unit 700 with three output voltage lines, according to some embodiments of the present disclosure. FIG. 5 is similar to the power management unit 200 of FIG. 2 and FIG. 3, however, power management unit 700 supports a third output voltage line. To the extent that elements of power management unit 700 occur in the examples of FIG. 2 and FIG. 3, further description of those elements can be found above. In the example shown in FIG. 5, the first output voltage line is associated with DC-DC converter 708 (e.g., a boost converter), the second output voltage line is associated with DC-DC converter 710 (e.g., a buck/boost converter), and the third output voltage line is associated with both DC-DC converters 708 and 710.

In some embodiments, a first set of switches for power management unit 700, is associated with DC-DC converter 708, and/or with the first output voltage line. For example, the first set of switches may include S1a and S2, or the first set of switches may include S1a, S1b and S2. Operation of the switches to perform a boost voltage function can be referred to with respect to FIGS. 2 and 3 above. Additionally, the second set of switches for PMU 700 may include S3, S4, S5 (e.g., a single-pole-double-throw switch), S6a and S6b. In some embodiments, the second set of switches is only associated with the second output voltage line, and therefore includes S5, S3, S4 and S6b. In some embodiments, a third set of switches is associated with the third output voltage line, such as switches S8, S9, S1b, S10, S6a, S3, S4 and S5. A fourth set of switches may be associated with the first output voltage line and the second output voltage line. A fifth set of switches may be associated with the first output voltage line and the third output voltage line (e.g., S8). A sixth set of switches may be associated with the second output voltage line and the third output voltage line.

Figure 6:
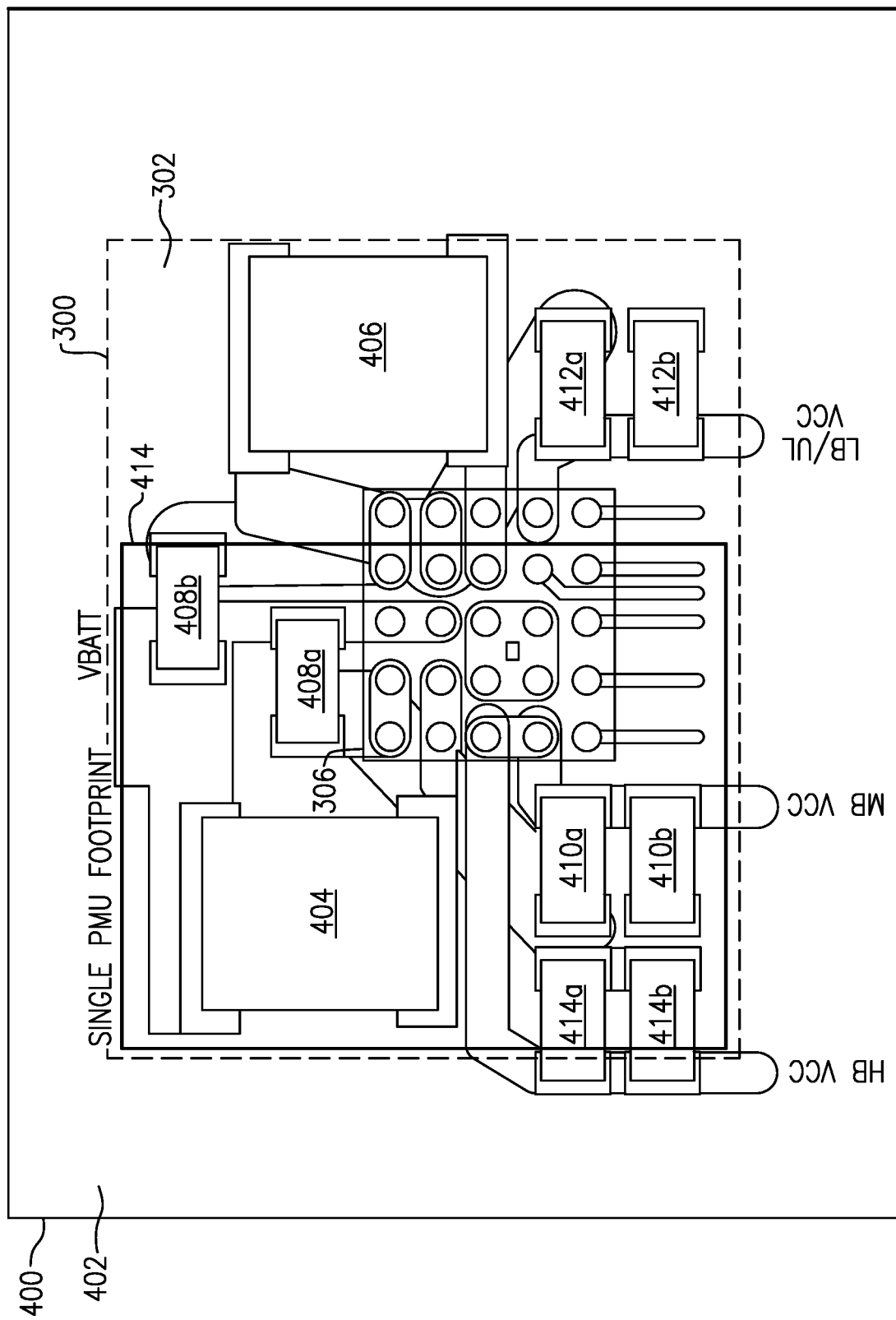
FIG. 6 is a graphical representation of a packaged module comprising a power management device with three output voltage lines, according to some embodiments of the present disclosure.

FIG. 6 is a graphical representation of a packaged module comprising a power management device with three output voltage lines, according to some embodiments of the present disclosure. FIG. 6 is similar to the packaged module described with respect to FIG. 4, however, as can be seen in FIG. 6, an additional set of capacitors 416a and 416b are supported for an additional output voltage line.

Figure 7:
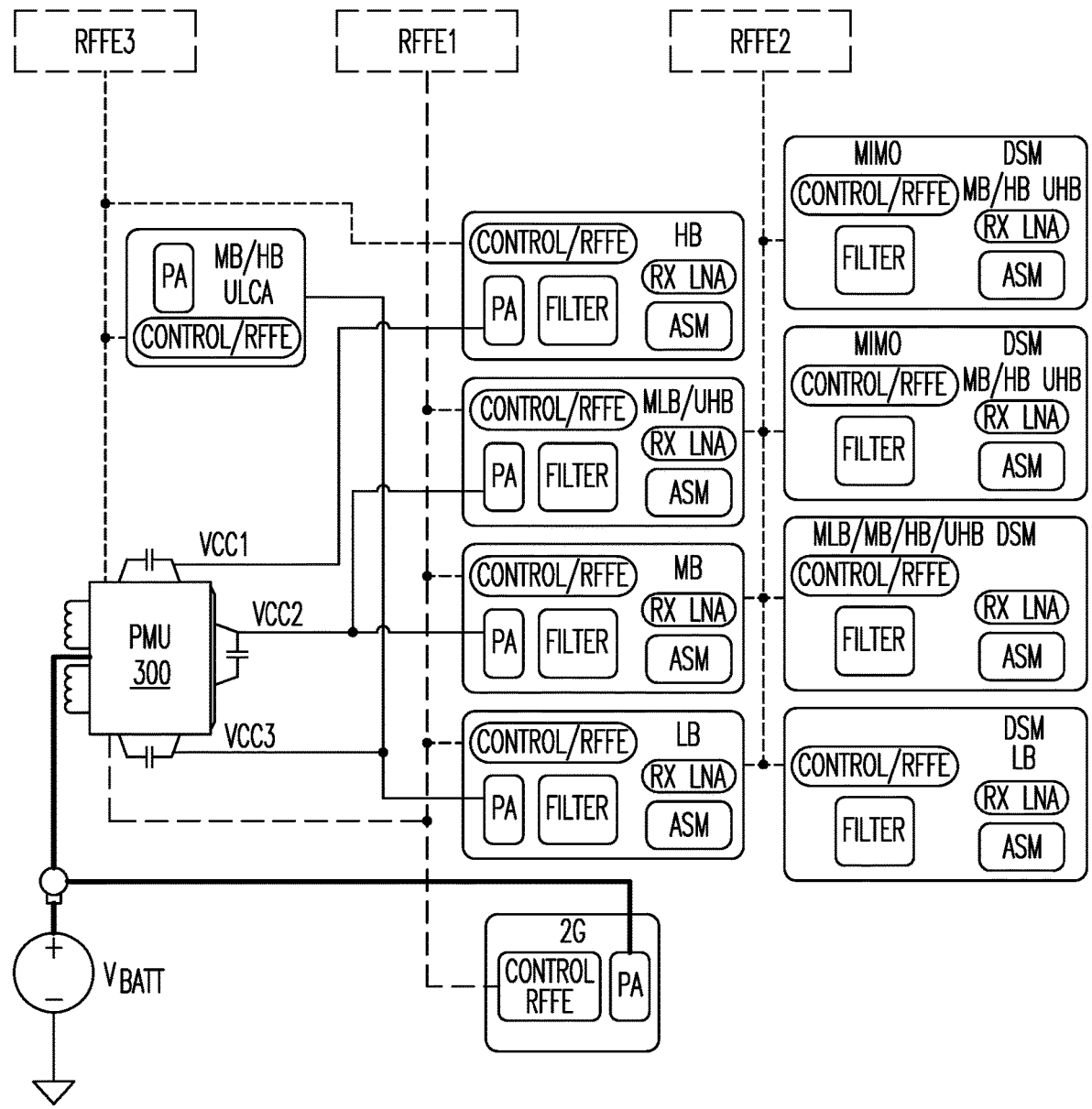
FIG. 7 is a schematic diagram of a carrier aggregation system supported by a power management device, according to some embodiments of the present disclosure.

FIG. 7 is a schematic diagram of a carrier aggregation system supported by a power management device, according to some embodiments of the present disclosure. As can be seen in FIG. 7, a PMU 700 can support multiple output voltages (e.g., VCC1, VCC2, VCC3), and have a corresponding controller and RFFE to support various front-end circuit blocks for HB (high-band), MLB (mid-low-band), UHB (ultra-high-band), MB (mid-band), LB (low-band), MB/HB ULCA and also 2G carrier circuitry in a system powered by a DC voltage source as shown. Various combinations of output voltages can therefore be supported by this single PMU 700 (or 300).

Figure 8:
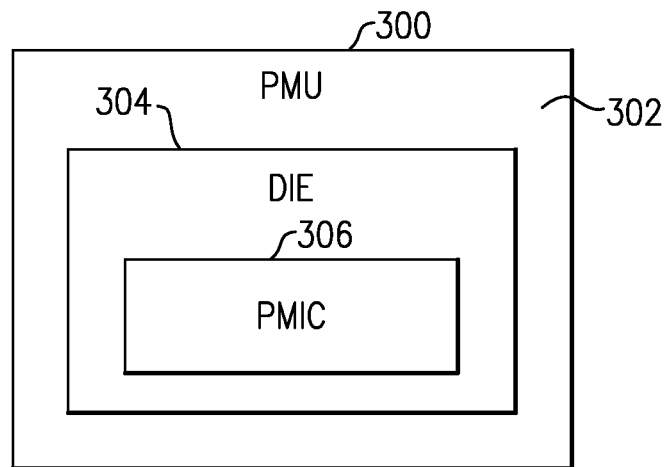
FIG. 8 is a block diagram of a power management unit, according to some embodiments of the present disclosure.

FIG. 8 shows that in some embodiments, some or all of a power management integrated circuit (PMIC) 306 having one or more features as described herein can be implemented on a semiconductor die 302. Additionally, a PMU 300, as described herein, may implement a die 304 with a PMIC 306. Such a PMU 300 can include a substrate 302 configured to implement some or all of one or more components such as inductors, capacitors, resistors, filters, pins, ports, and/or other interfacing parts.

In some embodiments, some or all of the capacitances and inductances utilized by PMIC 306 within PMU 300 can be implemented on the foregoing substrate 302. For example, a capacitance can be implemented as a MIM (metal-insulator-metal) capacitor, a MIS (metal-insulator-semiconductor) capacitor, a modified form of transistor, etc. An inductance can be implemented as a metal trace, a portion of a conductor, or some combination thereof.

Additionally, die 304 may also have a semiconductor substrate. In the context of the example switches described herein in reference to FIG. 2, FIGS. 3 and 5, the semiconductor substrate 302 can be, for example, a silicon substrate, a silicon-germanium substrate, or a silicon-on-insulator (SOI) substrate, if the switches are implemented as field-effect transistors (FETs). In another example, where bipolar-junction transistors (BJTs) are utilized in the PMIC 306, the semiconductor substrate can be, for example, a silicon substrate or a gallium arsenide substrate.

Figure 9:
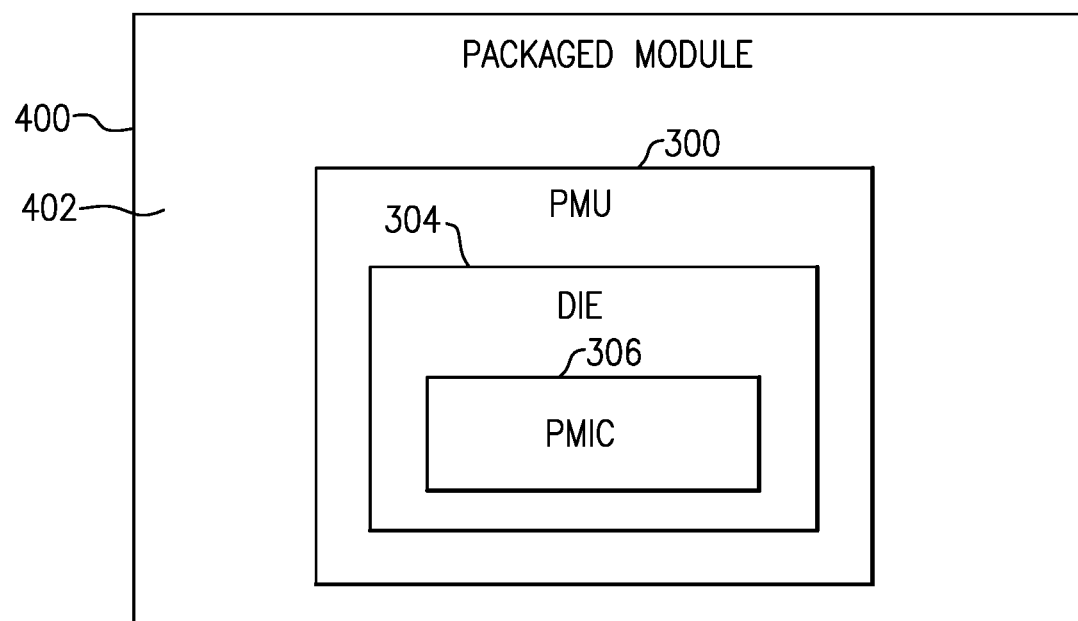
FIG. 9 is a block diagram of a packaged module comprising a power management unit, according to some embodiments of the present disclosure.

FIG. 9 shows that in some embodiments, some or all of a PMU 300 having one or more features as described herein can be implemented on a packaged module 400. Such a module can include a packaging substrate 402 configured to receive a plurality of components such as one or more die, one or more modules and one or more passive components.

Figure 10:
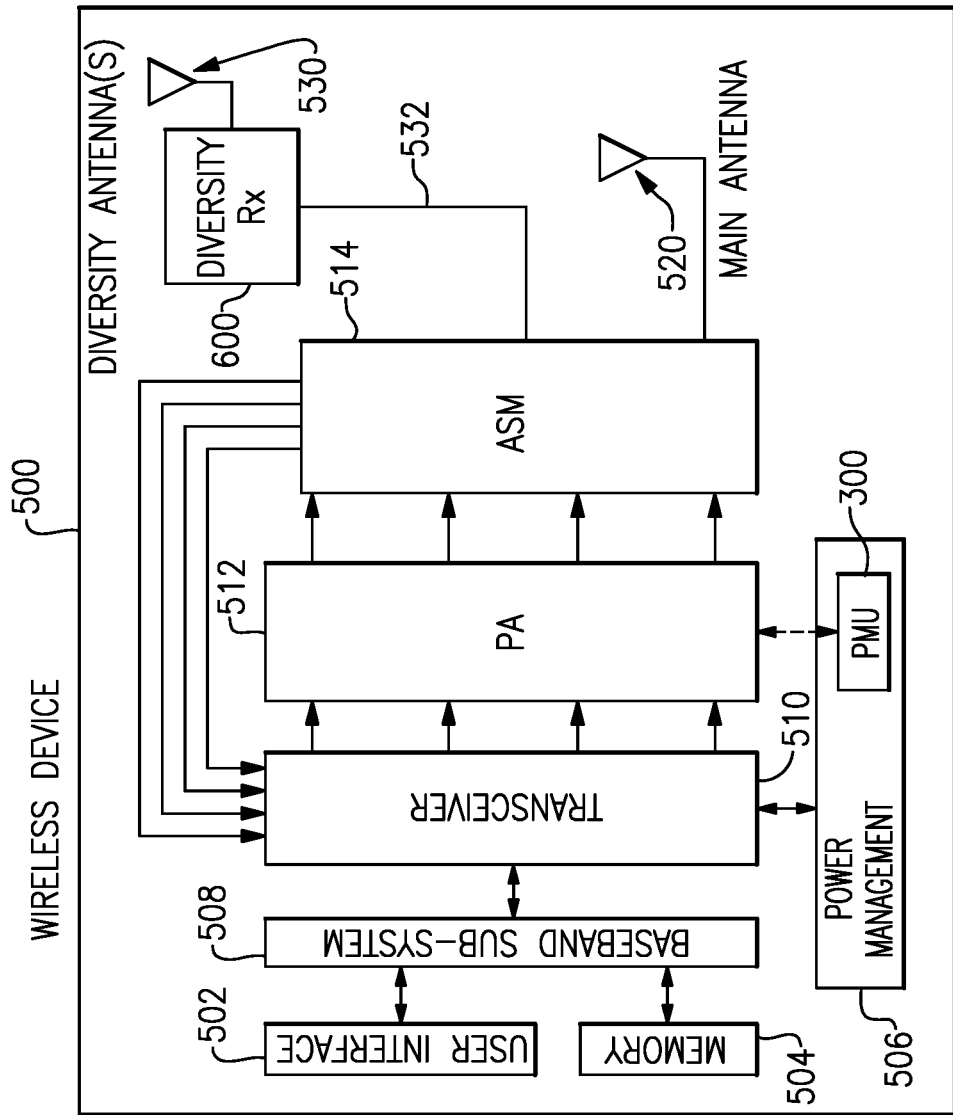
FIG. 10 shows an example of a wireless device having one or more features as described herein.

FIG. 10 depicts an example wireless device 500 having one or more advantageous features described herein. In some embodiments, a power management unit having one or more features as described herein can be implemented in each of one or more places in such a wireless device. For example, in some embodiments, such advantageous features can be implemented in a module such as a power management module 506 having one or more power management units (PMUs).

In the example of FIG. 10, power amplifiers (PAs) in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management module 506 that is configured to manage power for the operation of the wireless device 500. Such power management can also control operations of the baseband sub-system 508 and/or other components of the wireless device 500. In some embodiments, a PMU 300 is implemented within power management module 506, while in some implementations, a PMU 300 is implemented as a distinct module within wireless device 500. In some implementations, power management module 506 and/or PMU 300 are directly connected to the PA module 512.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 10, the DRx module 600 can be implemented between one or more diversity antennas (e.g., diversity antenna 530) and the antenna switch module (ASM) 514. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 600 can then be routed to the ASM through one or more signal paths.

In the example of FIG. 10, a main antenna 520 can be configured to, for example, facilitate transmission of RF signals from the PA module 512. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 3. It will be understood that at least some of the bands can be divided into sub-bands. It will also be understood that one or more features of the present disclosure can be implemented with frequency ranges that do not have designations such as the examples of Table 3.

TABLE 3

| Band | Mode | Tx Freq Range (MHz) | Rx Frequency Range (MHz) |
|---|---|---|---|
| B1 | FDD | 1,920–1,980 | 2,110–2,170 |
| B2 | FDD | 1,850–1,910 | 1,930–1,990 |
| B3 | FDD | 1,710–1,785 | 1,805–1,880 |
| B4 | FDD | 1,710–1,755 | 2,110–2,155 |
| B5 | FDD | 824–849 | 869–894 |
| B6 | FDD | 830–840 | 875–885 |
| B7 | FDD | 2,500–2,570 | 2,620–2,690 |
| B8 | FDD | 880–915 | 925–960 |
| B9 | FDD | 1,749.9–1,784.9 | 1,844.9–1,879.9 |
| B10 | FDD | 1,710–1,770 | 2,110–2,170 |
| B11 | FDD | 1,427.9–1,447.9 | 1,475.9–1,495.9 |
| B12 | FDD | 699–716 | 729–746 |
| B13 | FDD | 777–787 | 746–756 |
| B14 | FDD | 788–798 | 758–768 |
| B15 | FDD | 1,900–1,920 | 2,600–2,620 |
| B16 | FDD | 2,010–2,025 | 2,585–2,600 |
| B17 | FDD | 704–716 | 734–746 |
| B18 | FDD | 815–830 | 860–875 |
| B19 | FDD | 830–845 | 875–890 |
| B20 | FDD | 832–862 | 791–821 |
| B21 | FDD | 1,447.9–1,462.9 | 1,495.9–1,510.9 |
| B22 | FDD | 3,410–3,490 | 3,510–3,590 |
| B23 | FDD | 2,000–2,020 | 2,180–2,200 |
| B24 | FDD | 1,626.5–1,660.5 | 1,525–1,559 |

TABLE 3-continued

| Band | Mode | Tx Freq Range (MHz) | Rx Frequency Range (MHz) |
|---|---|---|---|
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

It is noted that while some examples are described herein in the context of carrier aggregation of two bands, one or more features of the present disclosure can also be implemented in configurations involving carrier aggregation of different numbers of bands.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A carrier aggregation system comprising:
a first front-end circuit block including one or more power amplifiers associated with a high band;
a second front-end circuit block including one or more power amplifiers associated with a low-band;
a third front-end circuit block including one or more power amplifiers associated with a mid-band; and
a power management device including a first DC-DC converter coupled to a first output voltage line, a second DC-DC converter coupled to a second output voltage line, the first DC-DC converter and the second DC-DC converter coupled to a third output voltage line configured to provide a combined output voltage from the first DC-DC converter and the second DC-DC converter, an output from the first DC-DC converter directly connected to the third output voltage line, an output from the second DC-DC converter directly connected to the third output voltage line, the first output voltage line coupled to the first front-end circuit block, the second output voltage line coupled to the second front-end circuit block, the third output voltage line coupled to the third front-end circuit block, the power management device configured to provide a plurality of output voltages to support a plurality of carrier aggregation combinations.

2. The carrier aggregation system of claim 1 wherein the power management device includes a plurality of inductors and a plurality of capacitors associated with the first DC-DC converter and the second DC-DC converter.

3. The carrier aggregation system of claim 1 wherein components of the power management device are implemented on a common die.

4. The carrier aggregation system of claim 1 wherein the power management device is configured to support simultaneous operation of a plurality of front-end circuit blocks, the plurality of front-end circuit blocks including one or more of the first front-end circuit block, the second front-end circuit block, or the third front-end circuit block.

5. The carrier aggregation system of claim 4 wherein the plurality of front-end circuit blocks includes one or more of: a high-band front-end circuit block, a mid-low-band front-end circuit block, an ultra-high-band front-end circuit block, a mid-band front-end circuit block, a low-band front-end circuit block, or a mid-band/high-band uplink carrier aggregation front-end circuit block.

6. The carrier aggregation system of claim 1 wherein the power management device has a reduced area compared to a carrier aggregation system including a respective power management device for each of a plurality of front-end circuit blocks.

7. The carrier aggregation system of claim 1 wherein the first DC-DC converter is a boost converter.

8. The carrier aggregation system of claim 1 wherein the second DC-DC converter is a buck/boost converter.

9. The carrier aggregation system of claim 1 wherein the power management device includes a first set of switches associated with the first DC-DC converter and a second set of switches associated with the second DC-DC converter.

10. The carrier aggregation system of claim 9 further comprising a controller configured to toggle one or more switches of the first set of switches and one or more switches of the second set of switches.

11. The carrier aggregation system of claim 10 wherein the controller is configured to receive feedback from the first output voltage line and to receive feedback from the second output voltage line.

12. The carrier aggregation system of claim 11 wherein the controller toggles the one or more switches of the first set of switches based on the feedback received from the first output voltage line and toggles the one or more switches of the second set of switches based on the feedback received from the second output voltage line.

13. The carrier aggregation system of claim 10 wherein the power management device further includes a multi-mode radio-frequency front-end block communicatively coupled to the controller.

14. The carrier aggregation system of claim 13 wherein the multi-mode radio-frequency front-end block includes a plurality of registers defining a set of output voltages on the first output voltage line, the second output voltage line, and the third output voltage line.

15. The carrier aggregation system of claim 13 wherein the first DC-DC converter, the second DC-DC converter, the controller, and the multi-mode radio-frequency front-end block are all implemented on a single semiconductor die.

16. The carrier aggregation system of claim 9 wherein the power management device further includes a third set of switches associated with the third output voltage line.

17. The carrier aggregation system of claim 16 wherein one or more switches of the first set of switches, the second set of switches, and the third set of switches are field-effect transistors.

18. The carrier aggregation system of claim 1 wherein the first DC-DC converter is coupled to a first inductor and the second DC-DC converter is coupled to a second inductor.

19. The carrier aggregation system of claim 18 wherein the first inductor is coupled to a supply voltage and the second inductor is switchably coupled to the supply voltage.

20. The carrier aggregation system of claim 1 wherein the first front-end circuit block, the second front-end circuit block, and the third front-end circuit block each include one or more of: a filter, a low-noise amplifier, or an antenna switch module.

* * * * *